US012772872B2

(12) United States Patent
Yokoyama et al.

(10) Patent No.: US 12,772,872 B2
(45) Date of Patent: Oct. 20, 2026

(54) SEMICONDUCTOR DEVICE HAVING HEAT SINK PART THAT PROMOTES RESIN-FLOW

(71) Applicant: Mitsubishi Electric Corporation, Tokyo (JP)

(72) Inventors: Shuhei Yokoyama, Tokyo (JP); Shogo Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 338 days.

(21) Appl. No.: 18/480,886

(22) Filed: Oct. 4, 2023

(65) Prior Publication Data

US 2024/0355715 A1 Oct. 24, 2024

(30) Foreign Application Priority Data

Apr. 21, 2023 (JP) ................................ 2023-070150

(51) Int. Cl.
*H10W 70/40* (2026.01)
*H10W 40/22* (2026.01)
*H10W 90/00* (2026.01)
*H10W 90/10* (2026.01)

(52) U.S. Cl.
CPC ......... *H10W 70/481* (2026.01); *H10W 40/22* (2026.01); *H10W 70/411* (2026.01); *H10W 70/427* (2026.01); *H10W 70/461* (2026.01); *H10W 90/811* (2026.01); *H10W 90/10* (2026.01); *H10W 90/756* (2026.01)

(58) Field of Classification Search
CPC ......... H10W 70/40–481; H10W 90/10; H10W 90/811; H10W 40/20–28
See application file for complete search history.

(56) References Cited

U.S. PATENT DOCUMENTS

| | | | | |
|---|---|---|---|---|
| 5,703,399 | A | 12/1997 | Majumdar et al. | |
| 2003/0075783 | A1 | 4/2003 | Yoshihara et al. | |
| 2017/0271230 | A1 | 9/2017 | Inaba | |
| 2019/0355718 | A1* | 11/2019 | Nakano ................ | H10D 84/406 |

FOREIGN PATENT DOCUMENTS

| | | | |
|---|---|---|---|
| JP | H08-148515 | A | 6/1996 |
| JP | H09-139461 | A | 5/1997 |
| JP | 2002-110886 | A | 4/2002 |
| JP | 2003-124437 | A | 4/2003 |
| JP | 2008-130757 | A | 6/2008 |
| JP | 2017-170627 | A | 9/2017 |

OTHER PUBLICATIONS

"Notice of Reasons for Refusal" Office Action issued in JP 2023-070150; mailed by the Japanese Patent Office on Jul. 14, 2026.

* cited by examiner

*Primary Examiner* — Kevin Parendo
(74) *Attorney, Agent, or Firm* — Studebaker Brackett PLLC

(57) ABSTRACT

A semiconductor apparatus includes: a heat sink; a die pad provided above and away from the heat sink; a power chip provided on a surface of the die pad opposite to a surface of the die pad facing the heat sink; and mold resin sealing a portion of the heat sink, the die pad and the power chip, wherein a surface of the heat sink facing the die pad includes a flow promotion part formed to separate from a plane including the die pad in a region overlapping the die pad and not overlapping the power chip.

14 Claims, 6 Drawing Sheets

SEMICONDUCTOR DEVICE HAVING HEAT SINK PART THAT PROMOTES RESIN-FLOW

BACKGROUND OF THE INVENTION

Field

The present disclosure relates to a molded semiconductor apparatus.

Background

In a conventional technique, there has been disclosed a semiconductor apparatus that includes a semiconductor device, a lead frame, and a dissipating metal plate and in which the semiconductor device, the lead frame, and the dissipating metal plate are molded (e.g., Patent Literature 1).

Patent Literature 1: JP8-148515 A

SUMMARY

However, in the conventional technique, there has been a problem that when a semiconductor device is sealed with resin, a space between the lead frame and the dissipating metal plate may be unfilled with the resin when narrow.

The present disclosure has been made to solve the above-described problem, and has its object to provide a semiconductor apparatus in which resin is sufficiently filled between a lead frame and a dissipating metal plate.

Solution to Problem

A semiconductor apparatus according to the present disclosure includes: a heat sink; a die pad provided above and away from the heat sink; a power chip provided on a surface of the die pad opposite to a surface of the die pad facing the heat sink; and mold resin sealing a portion of the heat sink, the die pad and the power chip, wherein a surface of the heat sink facing the die pad includes a flow promotion part formed to separate from a plane including the die pad in a region overlapping the die pad and not overlapping the power chip.

Advantageous Effects of Invention

In the semiconductor apparatus according to the present disclosure, even when a space between the lead frame and the heat sink is narrow, resin is sufficiently filled between the lead frame and the dissipating metal plate.

DESCRIPTION OF EMBODIMENTS

Figure 1:
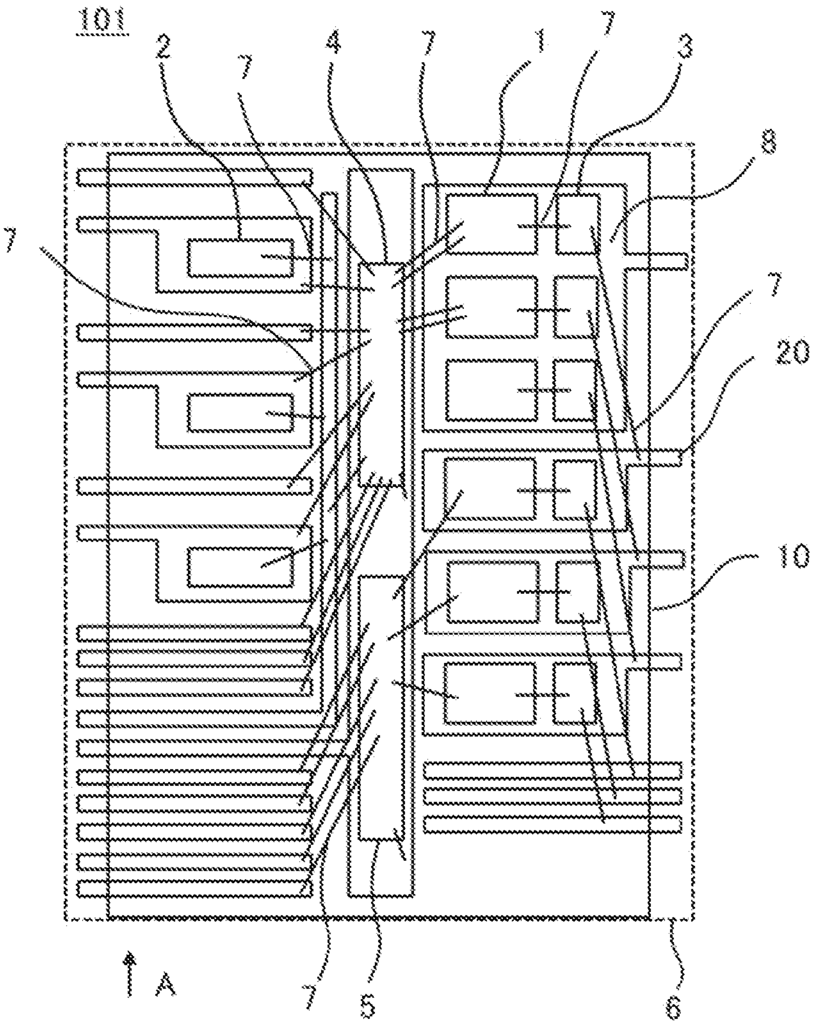
FIG. 1 is a schematic top view of the semiconductor apparatus according to the first embodiment.

Embodiments of the present disclosure will be described below with reference to the accompanying drawings. The drawings are schematic, and mutual relationships among sizes and positions respectively illustrated in different drawings are not necessarily accurately described but can be appropriately changed. In the following description, similar components are respectively denoted by the same reference numerals, and respective names and functions of the components are identical or similar. Accordingly, detailed description thereof may be omitted.

First Embodiment

A semiconductor apparatus 101 according to a first embodiment will be described with reference to FIGS. 1 to 4. FIG. 1 is a schematic top view of the semiconductor apparatus 101 according to the first embodiment.

As illustrated in FIG. 1, the semiconductor apparatus 101 according to the present embodiment includes a plurality of power chips (switching devices) 1, a plurality of free wheeling diodes (diode devices) 3 respectively electrically connected to the plurality of power chips 1, a high voltage IC 4 electrically connected to the high voltage side of the power chips 1, a low voltage IC 5 electrically connected to the low voltage side of the power chips 1, a diode (bootstrap diode) 2 forming a bootstrap circuit having at least its portion electrically connected to the high voltage IC 4, a lead frame 6 in which elements such as the power chips 1, the diode 2, the free wheeling diodes 3, the high voltage IC 4, and the low voltage IC 5 are installed, and a plurality of wires 7 each electrically connecting the elements to each other.

The lead frame 6 is indicated by a dotted line in FIG. 1. A plurality of members are brought together into the lead frame 6. That is, the lead frame 6 includes a die pad 8 on which the power chips 1 are placed and other portions. The power chips 1 are provided on an upper surface of the die pad 8. Examples of the portions other than the die pad 8 in the lead frame 6 include portions respectively provided with the diode 2, the high voltage IC 4, and the low voltage IC 5 and portions each functioning as a terminal.

The power chips 1, the bootstrap diode 2, the free wheeling diodes 3, the high voltage IC 4, and the low voltage IC 5 are each provided on an upper surface of the lead frame 6. As illustrated in FIG. 1, the six power chips 1 are provided in an up-down direction in the drawing, for example, on an upper surface of the lead frame 6.

There are provided a plurality of die pads 8, for example. In FIG. 1, the four die pads 8 are provided in the up-down direction in the drawing. Only the upper die pad 8 has the three power chips 1, and the other die pads 8 respectively have the one power chip 1. The six free wheeling diodes 3 are provided in the up-down direction in the drawing, for example, on the upper surface of the lead frame 6.

The free wheeling diodes 3 are respectively provided to correspond to positions where the power chips 1 are installed, and are provided in the same number as that of the power chips 1 in each of the plurality of die pads 8. Three bootstrap diodes 2, for example, are provided on an upper surface of a portion different from the die pad 8 in the lead frame 6.

As illustrated in FIG. 1, the semiconductor apparatus 101 according to the present embodiment includes an RC-IGBT obtained by integrating the power chip 1 and the free wheeling diode 3, for example, as a semiconductor device. The semiconductor device may not be an RC-IGBT.

The one high voltage IC 4, for example, is provided on the upper surface of the portion different from the die pad 8 in the lead frame 6. The one low voltage IC 5, for example, is provided on the upper surface of the portion different from the die pad 8 in the lead frame 6. In the present embodiment, the high voltage IC 4 and the low voltage IC 5 are provided on the same lead frame 6. In FIG. 1, only some of the elements such as the power chips 1, the diode 2, the free wheeling diodes 3, the high voltage IC 4, and the low voltage IC 5 are respectively denoted by reference numerals for apparent simplicity of the drawing.

Each of the plurality of wires 7 electrically connects the bootstrap diode 2 and the lead frame 6 to each other. The wire 7 electrically connects the high voltage IC 4 and the lead frame 6 to each other. The wire 7 electrically connects the high voltage IC 4 and the power chip 1 to each other. The wire 7 electrically connects the low voltage IC 5 and the lead frame 6 to each other. The wire 7 electrically connects the low voltage IC 5 and the power chip 1 to each other. The wire 7 electrically connects the power chip 1 and the free wheeling diode 3 to each other. The wire 7 electrically connects the free wheeling diode 3 and the lead frame 6 to each other. In FIG. 1, all linear components that connect the elements such as the power chips 1, the diode 2, the free wheeling diodes 3, the high voltage IC 4, and the low voltage IC 5 respectively represent the wires 7, and only some of the wires 7 are respectively denoted by reference numerals for apparent simplicity of the drawing.

As illustrated in FIG. 1, the elements such as the power chips 1, the diode 2, the free wheeling diodes 3, the high voltage IC 4, and the low voltage IC 5 and a portion of the lead frame 6 are sealed with mold resin 10.

Figure 2:
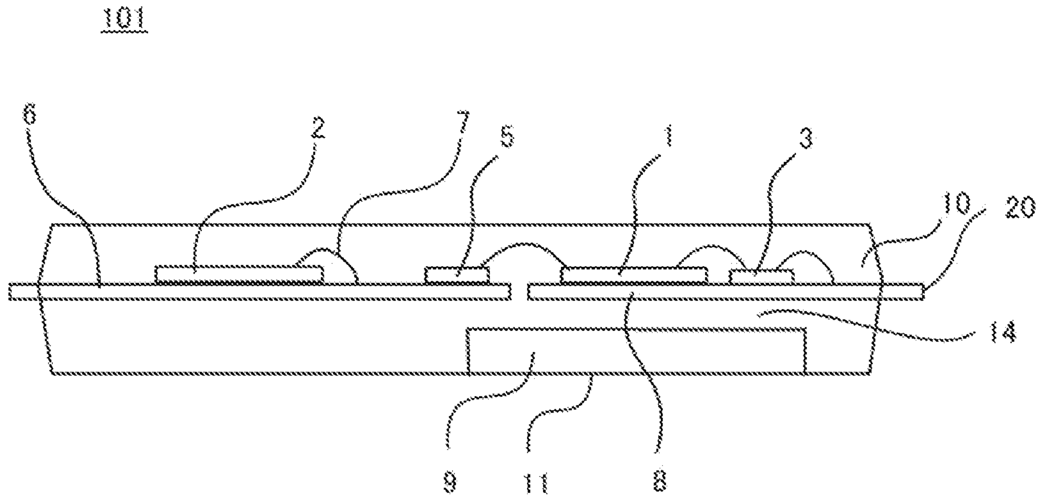
FIG. 2 is a side view of the semiconductor apparatus according to the first embodiment.

FIG. 2 is a side view of the semiconductor apparatus 101 according to the first embodiment. FIG. 2 is a diagram corresponding to a side surface of the semiconductor apparatus 101 viewed from below from the perspective of FIG. 1 (direction A in FIG. 1). As illustrated in FIG. 2, the semiconductor apparatus 101 includes a heat sink 9 on the side different from the side, on which each of the elements is provided, of the lead frame 6. That is, the heat sink 9 is provided on the lower surface side of the lead frame 6. The heat sink 9 is provided at a position, which corresponds to a lower surface of particularly the die pad 8, of the lead frame 6. The heat sink 9 receives heat generated by the power chip 1, and dissipates the heat out of the semiconductor apparatus 101.

The power chip 1 is provided on the upper surface of the die pad 8 included in the lead frame 6. That is, the power chip 1 is provided on a surface on the opposite side to a surface, which faces the heat sink 9, of the die pad 8.

The power chip 1, the bootstrap diode 2, the free wheeling diode 3, the high voltage IC 4, the low voltage IC 5, a portion of the lead frame 6, the wires 7, and a portion of the heat sink 9 are sealed with the mold resin 10.

That is, the whole of the power chip 1, the bootstrap diode 2, the free wheeling diode 3, the high voltage IC 4, the low voltage IC 5, and the wires 7 is sealed with the mold resin 10. On the other hand, the respective portions of the lead frame 6 and the heat sink 9 are exposed from the mold resin 10.

A fin not illustrated is provided on a lower surface of the semiconductor apparatus 101. The fin cools the semiconductor apparatus 101. As illustrated in FIG. 2, a lower surface as a fin attachment surface 11, to which the fin is attached, of the heat sink 9 is exposed from the mold resin 10.

The fin is provided in contact with the heat sink 9 and the mold resin 10 on the lower surface of the semiconductor apparatus 101. The lead frame 6 and the fin are electrically insulated from each other by the mold resin 10.

An insulating layer 14 is provided between the lead frame 6 and the heat sink 9. The insulating layer 14 insulates the lead frame 6 and the heat sink 9 from each other. The insulating layer 14 is molded integrally with the mold resin 10 when filled with the mold resin 10.

The lead frame 6 and the heat sink 9 are spaced apart from each other with a predetermined distance kept therebetween. That is, the lead frame 6 is provided above and away from the heat sink 9. Accordingly, the die pad 8 included in the lead frame 6 is provided above and away from the heat sink 9. The mold resin 10 is poured between the die pad 8 and the heat sink 9. A surface including the die pad 8 and a surface including the heat sink 9 are desirably parallel to each other. When the surface including the lead frame 6 and the surface including the heat sink 9 are parallel to each other, a uniform heat dissipation effect is obtained for heat dissipation of the power chip 1 and the free wheeling diode 3.

The mold resin 10 is filled from the near side from the perspective of FIG. 2, for example.

As illustrated in FIG. 1, the lead frame 6 includes a terminal part 20 exposed from the mold resin 10. The lead frame 6 is exposed from two surfaces of the mold resin 10 in a left-right direction of FIG. 1, for example. The terminal part 20 exposed from the mold resin 10 in the lead frame 6 functions as a lead terminal.

A lead terminal exposed from a surface close to the lead frame 6 provided with the bootstrap diode 2, i.e., a surface on the left side of FIG. 1 is a control-side terminal. The terminal part 20 exposed from a surface on which the lead frame 6 provided with the power chip 1 is positioned, i.e., a surface on the right side of FIG. 1 is a power-side terminal as a lead terminal.

The control-side terminal and the power-side terminal are provided to be respectively exposed from different surfaces, for example, as illustrated in FIG. 1.

The lead frame 6 may be exposed from a surface different from the surfaces illustrated in FIG. 1. The entire lead frame 6 may be sealed with the mold resin 10.

The mold resin 10 is filled in the direction A illustrated in FIG. 1, for example. When the semiconductor apparatus is manufactured, the elements such as the power chips 1, the diode 2, the free wheeling diodes 3, the high voltage IC 4, and the low voltage IC 5 and a portion of the lead frame 6 are installed in a mold not illustrated, and the heated mold resin 10 having fluidity is injected into the mold. An injection port of the mold resin 10 in the mold may exist on a side surface viewed in the direction A illustrated in FIG. 1, i.e., a side surface illustrated in FIG. 2 and the side in the direction A illustrated in FIG. 3 regardless of its shape and position.

Figure 3:
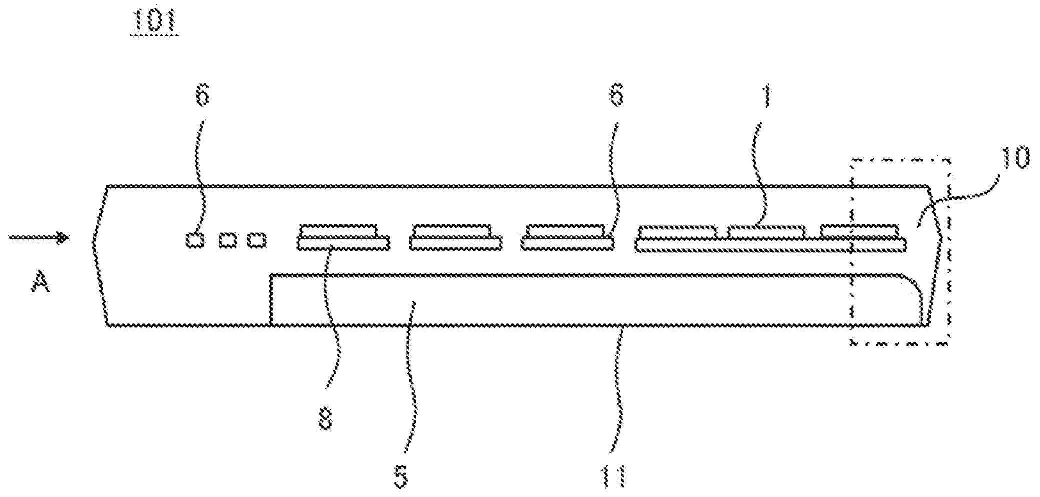
FIG. 3 is a side view of the semiconductor apparatus according to the first embodiment.

FIG. 3 is a side view of the semiconductor apparatus 101 according to the first embodiment. As illustrated in FIG. 3, the heat sink 9 is provided below the power chip 1 via the lead frame 6. In FIG. 3, a portion, where the power chip 1 is installed, of the lead frame 6 is particularly the die pad 8.

Figure 4:
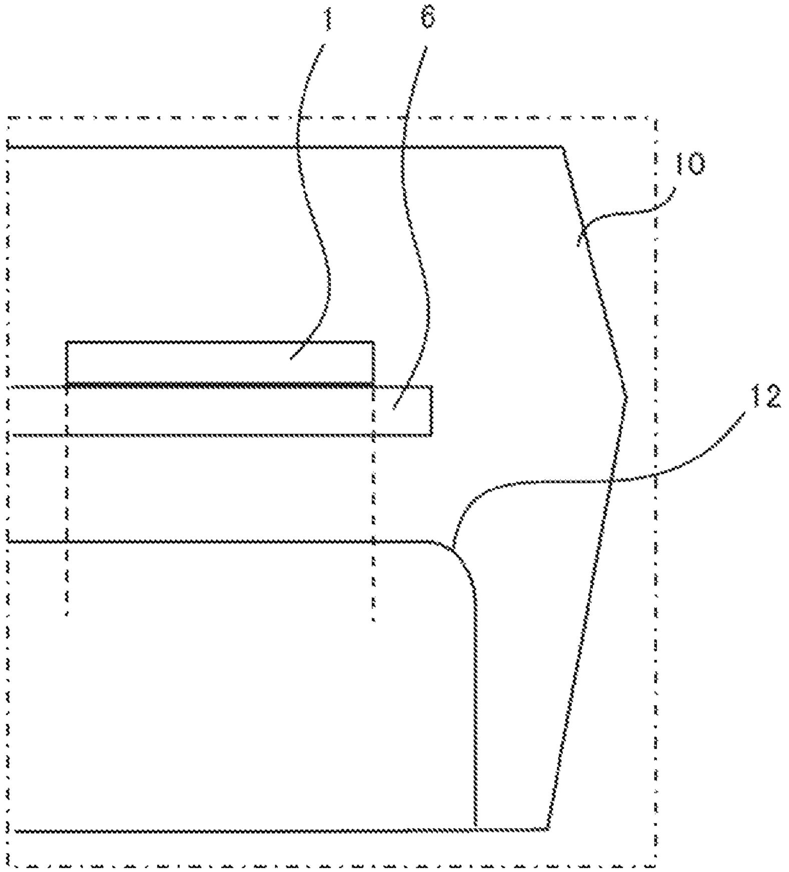
FIG. 4 is an enlarged view of the heat sink in the semiconductor apparatus according to the first embodiment.

FIG. 4 is an enlarged view of the heat sink 9 in the semiconductor apparatus 101 according to the first embodiment. FIG. 4 illustrates a portion enclosed by a one-dot and dash line on the right side from the perspective of FIG. 3 in an enlarged manner.

As illustrated in FIG. 4, the heat sink 9 includes a flow promotion part 12 formed to gradually separate from a plane including the power chip 1 from a central portion to an end portion of an upper surface of the heat sink 9. That is, the upper surface as a surface, which faces the die pad 8, of the heat sink 9 includes the flow promotion part 12 formed to separate from a plane including the die pad 8 in a region overlapping the die pad 8 and not overlapping the power chip 1 in a planar view. The flow promotion part 12 may have a curved shape or a so-called R shape. The flow promotion part 12 may have a linear shape.

As illustrated in FIG. 4, the flow promotion part 12 is not provided at a position corresponding to a lower surface of the power chip 1. Broken lines illustrated in FIG. 4 respectively represent ends of a region where the power chip 1 is provided. The flow promotion part 12 is provided at a position closer to an end of the heat sink 9 than the broken line, i.e., on the right side of the broken line from the perspective of FIG. 4. That is, a surface, which faces the lead frame 6, of the heat sink 9 includes the flow promotion part 12 formed to separate from the plane including the power chip 1 at a position, which is outside a region corresponding to the power chip 1 and faces an end portion of the lead frame 6, of the heat sink 9. The region, which corresponds to the power chip 1, of the heat sink 9 is a region of the heat sink 9 on the upper side of FIG. 4, i.e., hidden by the power chip 1 when the semiconductor apparatus is viewed from the side on which the power chip 1 is installed, for example.

The heat sink 9 is flat at the position that corresponds to the lower surface of the power chip 1, i.e., in a region sandwiched between the broken lines illustrated in FIG. 4. That is, the upper surface of the heat sink 9 is parallel to the plane including the power chip 1.

The flow promotion part 12 is not provided at the position corresponding to the lower surface of the power chip 1, i.e., a position immediately below a region where the power chip exists. In other words, the position, which corresponds to the lower surface of the power chip 1, of the heat sink 9 is parallel to the plane including the power chip 1, whereby the power chip 1 and the heat sink 9 can be prevented from separating from each other, thereby making it possible to prevent a heat dissipation performance from deteriorating.

On the other hand, for a positional relationship between the flow promotion part 12 and the lead frame 6, the flow promotion part 12 includes a position, which faces the flow promotion part 12, of the heat sink 9, i.e., a region on the upper side of FIG. 4, i.e., immediately below the end portion of the lead frame 6 when the semiconductor apparatus is viewed from the side on which the power chip 1 is installed.

The entire flow promotion part 12 may be included in the region immediately below the end portion of the lead frame 6, or a portion of the flow promotion part 12 may exist outside the region immediately below the end portion of the lead frame 6. That is, the end portion of the lead frame 6 may be included in a direction toward an upper surface of a region, where the flow promotion part 12 is formed, of the heat sink 9.

The end portion of the lead frame 6 is included in the direction toward the upper surface of the region, where the flow promotion part 12 is formed, of the heat sink 9, thereby making it possible to avoid the heat sink 9 increasing in size and making it possible to maximize the heat dissipation efficiency of the power chip 1.

As described above, in the present embodiment, the mold resin 10 is filled in the direction A illustrated in FIG. 3, that is, is filled from the left side from the perspective of FIG. 3. That is, the filling port of the mold resin 10 is provided on the left side from the perspective of FIG. 3.

An outer shape portion of the mold resin 10 is provided with a gate mark that differs in gloss from other portions of the mold resin 10. Alternatively, the outer shape portion of the mold resin 10 is provided with a gate mark that differs in height from a surface of an outer shape portion of the mold resin due to a hollow or a projection.

The outer shape portion of the mold resin 10 refers to the surface of the mold resin 10, that is, refers to a surface to which the mold resin 10 is exposed from the semiconductor apparatus 101. The gate mark is a mark remaining in the injection port into which the mold resin 10 is injected.

The flow promotion part 12 is provided in an end portion close to a surface on the opposite side to a surface into which the mold resin 10 is filled. That is, the flow promotion part 12 is provided in an end portion of a surface, which the mold resin 10 reaches latest, of the heat sink 9. That is, the flow promotion part 12 in the heat sink 9 is provided at a position on the opposite side to the side on which the gate mark is provided.

When the mold resin 10 is filled, pressure of the mold resin 10 is lower in a location farther from the filling port than that in a location closer to the filling port. Since the flow promotion part 12 is provided in the end portion of the surface, which the mold resin reaches latest, of the heat sink 9, an outlet used when the extra mold resin 10 is extruded out of the semiconductor apparatus 101 can be widened, thereby making it possible to increase the fluidity of the mold resin 10.

When the fluidity of the mold resin 10 can be increased, a resin void occurring when the mold resin 10 is filled can be extruded out of the semiconductor apparatus 101. If the resin void can be extruded, the mold resin 10 can be sufficiently filled between the lead frame 6 and the heat sink 9 even when a space between the lead frame 6 and the heat sink 9 is narrow, that is, when the insulating layer 14 is thin, thereby making it possible to improve a heat dissipation property and an insulation property.

The mold resin 10 is not necessarily filled from the left side from the perspective of FIG. 3. The flow promotion part 12 is not necessarily provided in the end portion of the surface that the mold resin 10 reaches latest.

Even when the flow promotion part 12 is provided on a surface closer to the surface, into which the mold resin 10 is filled, for example, the fluidity of the mold resin 10 can be increased.

The semiconductor apparatus 101 is molded using a transfer molding method. The semiconductor apparatus 101 is used for high power applications.

The bootstrap diode 2 may not be provided. A portion of the lead frame 6 may be bent, or may not be bent.

Second Embodiment

Figure 5:
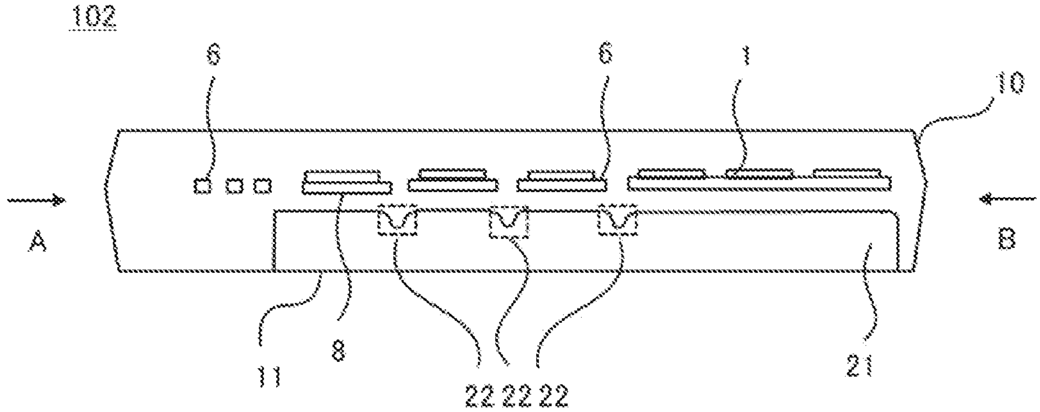
FIG. 5 is a side view of the semiconductor apparatus according to the second embodiment.

A semiconductor apparatus 102 according to a second embodiment will be described with reference to FIG. 5. Description of similar components to those in the first embodiment is omitted. In FIG. 5, the same reference numerals as those illustrated in FIGS. 1 to 4 respectively denote identical or corresponding portions.

FIG. 5 is a side view of the semiconductor apparatus 102 according to the second embodiment. FIG. 2 is a diagram corresponding to a side surface viewed from the left from the perspective of FIG. 1. A heat sink 21 in the semiconductor apparatus 102 according to the present embodiment differs from that in the first embodiment in that the heat sink 21 has a plurality of recesses 22, as illustrated in FIG. 5. Differences from the heat sink 9 in the first embodiment will be mainly described below.

As illustrated in FIG. 5, a surface, on the side of a plurality of die pads 8, of the heat sink 21, i.e., an upper surface of the heat sink 21 has the recesses 22 formed to gradually separate from a plane including power chips 1 at positions corresponding to spaces among the die pads 8. In FIG. 5, each of the plurality of recesses 22 is indicated by a square dotted line. The three recesses 22 are respectively provided to correspond to the number of the spaces among the die pads 8, for example. That is, the number of the recesses 22 to be provided is one smaller than the number of the die pads 8. The number of the recesses 22 to be provided in the heat sink 21 need not be limited to the number of the die pads 8. The number of the recesses 22 may be one, for example.

In the present embodiment, when the semiconductor apparatus is manufactured, mold resin 10 is filled in a direction in which the power chips 1 are arranged, i.e., in a direction in which the die pads 8 are arranged. In other words, the mold resin 10 is filled in a direction in which the plurality of recesses 22 are arranged. That is, the mold resin 10 is filled from the left side or the right side from the perspective of FIG. 5. The direction in which the resin is filled is direction A or direction B illustrated in FIG. 5.

When the recesses 22 are respectively provided at positions corresponding to the spaces among the plurality of die pads 8, the fluidity of the mold resin 10 is also improved at positions respectively corresponding to lower surfaces of the die pads 8 between lead frames 6 and the heat sink 21. Since the fluidity of the mold resin 10 is improved, a resin void occurring when the mold resin 10 is filled can be made easy to extrude out of the semiconductor apparatus 102.

Since the resin void is easy to exclude out of the semiconductor apparatus 102, the mold resin 10 can be sufficiently filled between the lead frames 6 and the heat sink 21. That is, an insulating layer 14 sufficiently filled with the mold resin 10 can be formed.

The recesses 22 are respectively provided among the plurality of die pads 8, and are not respectively provided at positions corresponding to lower surfaces of the power chips 1, that is, positions, which correspond to the lower surfaces of the power chips 1, of the heat sink 21 are parallel to the plane including the power chips 1.

Since the recesses 22 are not respectively provided at the positions corresponding to the lower surfaces of the power chips 1, the power chips 1 and the heat sink 21 can be prevented from separating from each other, thereby making it possible to prevent a heat dissipation performance from deteriorating.

Third Embodiment

Figure 6:
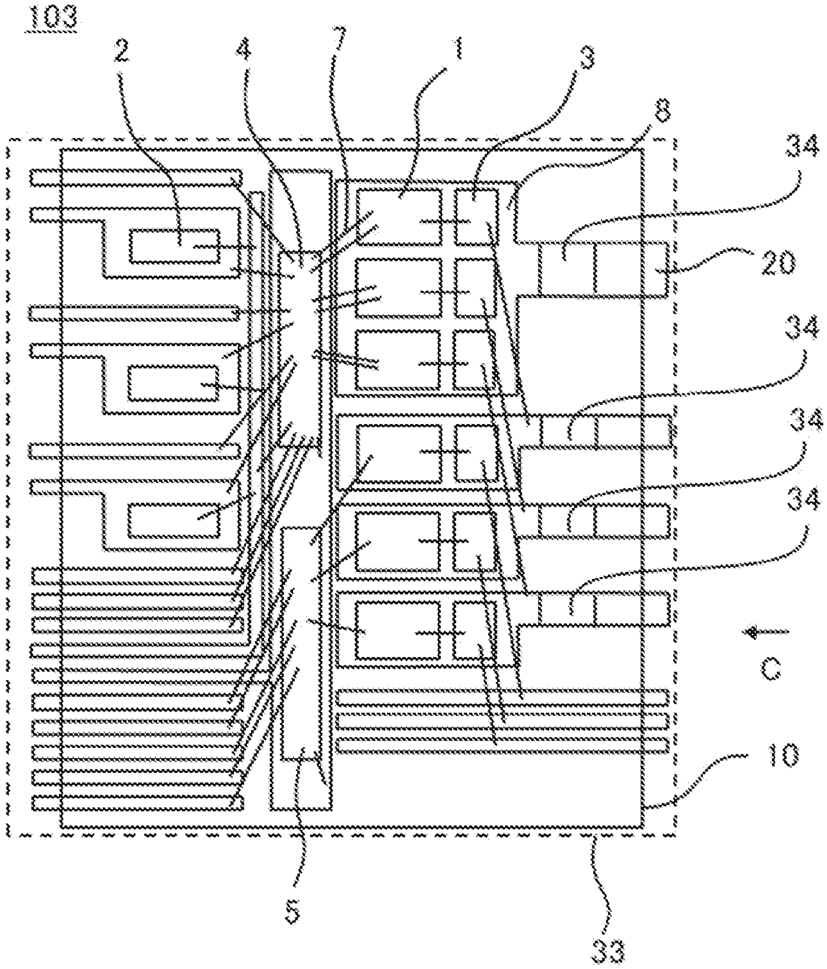
FIG. 6 is a top view of the semiconductor apparatus according to the third embodiment.
Figure 7:
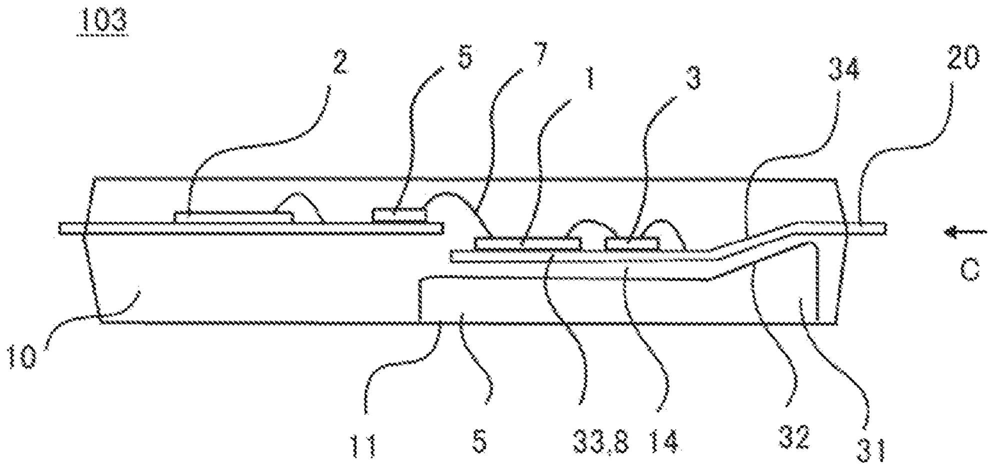
FIG. 7 is a side view of the semiconductor apparatus according to the third embodiment.
Figure 8:
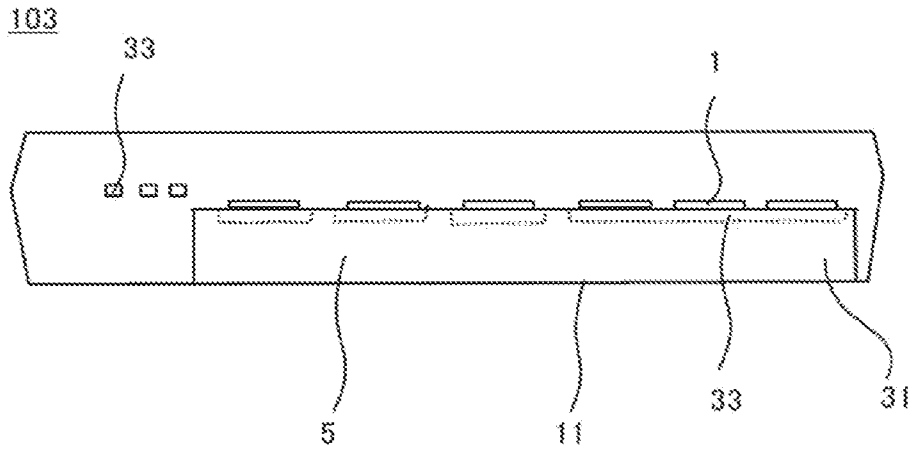
FIG. 8 is a side view of the semiconductor apparatus according to the third embodiment.

A semiconductor apparatus 103 according to a third embodiment will be described with reference to FIGS. 6 to 8. Description of similar components to those in the first embodiment is omitted. In FIGS. 6 to 8, the same reference numerals as those illustrated in FIGS. 1 to 5 respectively denote identical or corresponding portions.

The semiconductor apparatus 103 according to the present embodiment differs from that in the first embodiment in that a heat sink 31 includes an inclined part 32 and a lead frame 33 includes a bent part 34. Differences from the first embodiment will be mainly described below.

FIG. 6 is a top view of the semiconductor apparatus 103 according to the third embodiment. A lead frame 33 in the semiconductor apparatus 103 according to the present embodiment includes the bent part 34, as illustrated in FIG. 6. The bent part 34 is provided between a terminal part 20 exposed from mold resin 10 and a die pad 8 in the lead frame 33. That is, the bent part 34 connects the terminal part 20 and the die pad 8 to each other.

In the present embodiment, the mold resin 10 is filled in direction C illustrated in FIG. 6, for example. That is, the mold resin 10 is filled from the right side from the perspective of FIG. 6.

FIG. 7 is a side view of the semiconductor apparatus 103 according to the third embodiment. FIG. 7 is a diagram corresponding to a side surface viewed from below from the perspective of FIG. 6.

As illustrated in FIG. 7, the lead frame 33 includes the bent part 34 inclined to approach a lower surface of the heat sink 31 toward the die pad 8 from the terminal part 20. The bent part 34 is provided in a portion between a lead terminal 15 and the die pad 8 in the lead frame 33, for example. A surface including the terminal part 20 is provided at a position farther away from the heat sink 31 than a surface including the die pad 8.

The heat sink 31 includes the inclined part 32 along the bent part 34 in the lead frame 33. In other words, the bent part 34 in the lead frame 33 is formed along the inclined part 32 in the heat sink 31. The inclined part 32 is provided in a region overlapping the bent part 34 in a planar view in the heat sink 31.

The mold resin 10 is filled in the direction C illustrated in FIG. 7. That is, the mold resin 10 is filled from the right side from the perspective of FIG. 7.

The inclined part 32 in the heat sink 31 and the bent part 34 in the lead frame 33 are inclined to gradually approach a fin attachment surface 11 in a direction in which the mold resin 10 is filled. Accordingly, the mold resin 10 easily flows in an insulating layer 14.

In the insulating layer 14, the flow rate of the mold resin 10 increases, and the fluidity thereof is improved, whereby the fillability of the mold resin 10 is improved. Therefore, if the insulating layer 14 is thin, the mold resin 10 can be sufficiently filled between the lead frame 33 and the heat sink 31, thereby making it possible to improve a heat dissipation property and an insulation property.

FIG. 8 is a side view of the semiconductor apparatus 103 according to the third embodiment. FIG. 8 is a diagram corresponding to a side surface viewed in a rightward direction from the perspective of FIG. 6, i.e., in the direction C illustrated in FIG. 6.

A broken line illustrated in FIG. 8 indicates the lead frame 33. The lead frame 33 includes the bent part 34 inclined to approach the lower surface of the heat sink 31 toward the die pad 8 from the lead terminal 15. Accordingly, the die pad 8 to be provided with a power chip 1 is closer to the fin attachment surface 11 than a portion, which is farthest away from the fin attachment surface 11, of the heat sink 31, for example.

The die pad 8 may be provided at a location farther from the fin attachment surface 11 than the portion, which is farthest away from the fin attachment surface 11, of the heat sink 31.

The mold resin 10 is filled from the near side from the perspective of FIG. 8.

Fourth Embodiment

A semiconductor apparatus 104 according to a fourth embodiment will be described with reference to FIG. 9.

Description of similar components to those in the first embodiment is omitted. In FIG. 9, the same reference numerals as those illustrated in FIGS. 1 to 8 respectively denote identical or corresponding portions.

The semiconductor apparatus 104 according to the present embodiment differs from that in the third embodiment in that a bent part 42 in a lead frame 41 is provided with a slit 43. Differences from the third embodiment will be mainly described below.

Figure 9:
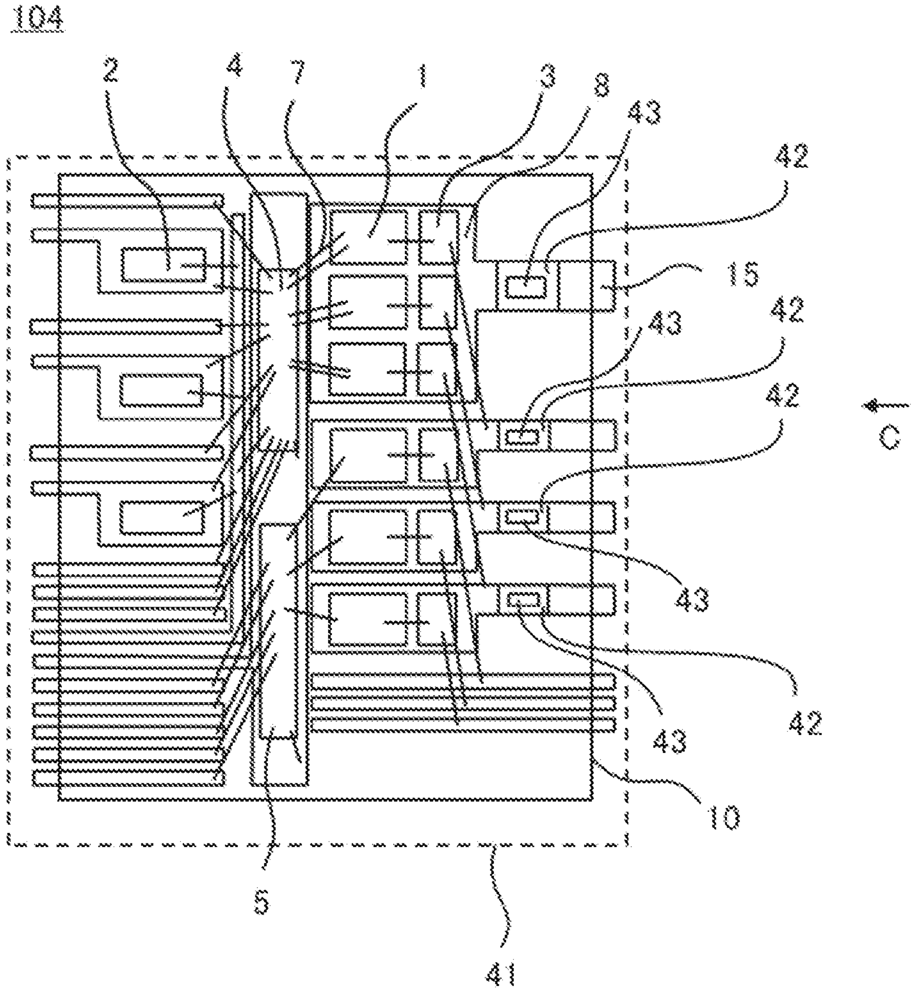
FIG. 9 is a top view of the semiconductor apparatus according to the fourth embodiment.

FIG. 9 is a top view of the semiconductor apparatus 104 according to the fourth embodiment. The lead frame 41 in the semiconductor apparatus 104 according to the present embodiment includes a plurality of slits 43, respectively, in a plurality of bent parts 42, as illustrated in FIG. 9.

Mold resin 10 is filled in direction C illustrated in FIG. 9. That is, the mold resin 10 is filled from the right side from the perspective of FIG. 9.

Since each of the bent parts 42 in the lead frame 41 is provided with the slit 43, the mold resin 10 also flows into an insulting layer 14 from an upper surface of the bent part 42. If the mold resin 10 also flows into the insulating layer 14 from the slit 43, the flow rate of the mold resin 10 in the insulating layer 14 increases. Even when the insulating layer 14 is thin, the mold resin 10 can be sufficiently filled between the lead frame 41 and a heat sink 9, thereby making it possible to improve a heat dissipation property. Although all the plurality of bent parts 42 are respectively provided with the slits 43 in FIG. 9, all the bent parts 42 need not be respectively provided with the slits 43, but only some of the bent parts 42 may be respectively provided with the slits 43.

Fifth Embodiment

A semiconductor apparatus 105 according to a fifth embodiment will be described. Description of similar components to those in the first embodiment is omitted.

In the semiconductor apparatus 105 according to the present embodiment, a switching device and a diode device are each formed of a wide bandgap semiconductor.

The switching device and the diode device each formed of the wide bandgap semiconductor are high in voltage resistance and are high in permissible current density. Accordingly, the switching device and the diode device can be miniaturized. When the miniaturized switching device and diode device are used, the semiconductor apparatus can be miniaturized.

The switching device and the diode device each formed of the wide bandgap semiconductor are also high in heat resistance. Accordingly, a heat sink and a fin can be miniaturized. Further, the wide bandgap semiconductor is low in power loss. Accordingly, the switching device and the diode device can be made highly efficient, and the semiconductor apparatus can be made highly efficient.

Although both the switching device and the diode device are each desirably formed of a wide bandgap semiconductor, either one of the elements may be formed of a wide band gap semiconductor.

Although in each of the above-described embodiments described in the present specification, there is a case where a material quality, a material, a dimension, and a shape of each of components and a relative arrangement relationship among the components or implementation conditions, for example, are described, they are illustrative in all aspects, and each of the embodiments is not limited to that described. Numerous modifications not illustrated are assumed within the scope of each of the embodiments. Examples include a case where any component is deformed, added, or omitted and a case where at least one component in at least one of the embodiments is extracted and is combined with components in the other embodiments.

Although preferred embodiments have been described in detail above, the present invention is not limited to the above-described embodiments, but various modifications and substitutions can be made to the above-described embodiments without departing from the scope of the invention as defined in the claims.

Aspects of the present disclosure will be collectively described as supplements.

(Supplementary Note 1)

A semiconductor apparatus comprising:

a heat sink;

a die pad provided above and away from the heat sink;

a power chip provided on a surface of the die pad opposite to a surface of the die pad facing the heat sink; and mold resin sealing a portion of the heat sink, the die pad and the power chip, wherein a surface of the heat sink facing the die pad includes a flow promotion part formed to separate from a plane including the die pad in a region overlapping the die pad and not overlapping the power chip.

(Supplementary Note 2)

The semiconductor apparatus according to Supplementary Note 1, wherein an outer shape portion of the mold resin is provided with a gate mark that differs in gloss from other portions of the mold resin or differs in height from a surface of an outer shape portion of the mold resin due to a hollow or a projection, and the flow promotion part of the heat sink is provided at a position on the opposite side to a side on which the gate mark is provided.

(Supplementary Note 3)

The semiconductor apparatus according to Supplementary Note 1 or 2, including a plurality of the power chips, wherein a surface of the heat sink on the die pad side includes recesses formed to separate from a plane including the die pad at positions corresponding to spaces among a plurality of the die pads.

(Supplementary Note 4)

The semiconductor apparatus according to any one of Supplementary Notes 1 to 3, wherein a lead frame provided above and away from the heat sink and having the die pad includes a terminal part exposed from the mold resin, and a bent part connecting the terminal part and the die pad, a surface including the terminal part is provided at a position farther away from the heat sink than a surface including the die pad, and the heat sink includes an inclined part provided along the bent part of the lead frame in a region overlapping the bent part in a planar view.

(Supplementary Note 5)

The semiconductor apparatus according to Supplementary Note 4, wherein the bent part in the lead frame is provided with a slit.

(Supplementary Note 6)

The semiconductor apparatus according to any one of Supplementary Notes 1 to 5, wherein the power chip includes an RC-IGBT.

(Supplementary Note 7)

The semiconductor apparatus according to any one of Supplementary Notes 1 to 6, wherein the power chip and a diode device are formed of wide bandgap semiconductor.

REFERENCE SIGNS LIST

1 power chip; 2 bootstrap diode; 3 free wheeling diode; 6, 33, 41 lead frame; 7 wire; 8 die pad; 9, 21, 31 heat sink;

10 mold resin; 12 flow promotion part; 14 insulating layer; 15 lead terminal; 22 recess; 32 inclined part; 34, 42 bent part; 43 slit; 101, 102, 103, 104 semiconductor apparatus Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2023-070150, filed on Apr. 21, 2023 including specification, claims, drawings and summary, on which the convention priority of the present application is based, is incorporated herein by reference in its entirety.

The invention claimed is:

1. A semiconductor apparatus comprising:
- a heat sink;
- a die pad provided above and spaced apart from the heat sink and extending in a first direction;
- a power chip provided on a surface of the die pad opposite to a surface of the die pad facing the heat sink; and
- mold resin sealing a portion of the heat sink, the die pad and the power chip,
- wherein a surface of the heat sink facing the die pad includes a first portion and a second portion connected to the first portion, the first portion having a first surface extending in the first direction, and the second portion including a second surface extending in a second direction away from the die pad, the second surface beginning to extend away from the die pad in a region on the surface of the heat sink overlapping the die pad and not overlapping the power chip as viewed in a direction toward the surface of the heat sink.

2. The semiconductor apparatus according to claim 1, wherein an outer shape portion of the mold resin is provided with a gate mark that differs in gloss from other portions of the mold resin or differs in height from a surface of the outer shape portion of the mold resin due to a hollow or a projection, and
- the second portion of the heat sink is provided at a position on the opposite side to a side on which the gate mark is provided.

3. The semiconductor apparatus according to claim 2, wherein the power chip and a diode device are formed of wide bandgap semiconductor.

4. The semiconductor apparatus according to claim 1, further comprising a plurality of the power chips on a plurality of the die pads, wherein the surface of the heat sink facing the die pads includes recesses located at positions corresponding to spaces between adjacent die pads.

5. The semiconductor apparatus according to claim 4, wherein the power chip and a diode device are formed of wide bandgap semiconductor.

6. The semiconductor apparatus according to claim 1, wherein a lead frame provided above and away from the heat sink and having the die pad includes a terminal part exposed from the mold resin, and a bent part connecting the terminal part and the die pad,
- a surface including the terminal part is provided at a position farther away from the heat sink than a surface including the die pad, and
- the heat sink includes an inclined part provided along the bent part of the lead frame in a region overlapping the bent part in a planar view.

7. The semiconductor apparatus according to claim 6, wherein the bent part in the lead frame is provided with a slit.

8. The semiconductor apparatus according to claim 7, wherein the power chip and a diode device are formed of wide bandgap semiconductor.

9. The semiconductor apparatus according to claim 6, wherein the power chip and a diode device are formed of wide bandgap semiconductor.

10. The semiconductor apparatus according to claim 1, wherein the power chip includes a reverse-conducting IGBT (RC-IGBT).

11. The semiconductor apparatus according to claim 10, wherein the power chip and a diode device are formed of wide bandgap semiconductor.

12. The semiconductor apparatus according to claim 1, wherein the power chip and a diode device are formed of wide bandgap semiconductor.

13. The semiconductor apparatus according to claim 1, wherein
- the second surface includes a curved surface that curves in the direction away from the die pad.

14. The semiconductor apparatus according to claim 1, wherein
- the second surface extends at an increased rate in the second direction toward a second end of the second portion.

* * * * *